(12) United States Patent
Bhargava et al.

(10) Patent No.: US 11,532,353 B2
(45) Date of Patent: Dec. 20, 2022

(54) CIRCUITRY APPORTIONING OF AN INTEGRATED CIRCUIT

(71) Applicant: Arm Limited, Cambridge (GB)

(72) Inventors: Mudit Bhargava, Austin, TX (US); Rahul Mathur, Austin, TX (US); Andy Wangkun Chen, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/162,532

(22) Filed: Jan. 29, 2021

(65) Prior Publication Data
US 2022/0246206 A1   Aug. 4, 2022

(51) Int. Cl.
*G11C 11/41*   (2006.01)
*G11C 11/419*   (2006.01)
*G11C 11/418*   (2006.01)

(52) U.S. Cl.
CPC .......... *G11C 11/419* (2013.01); *G11C 11/418* (2013.01)

(58) Field of Classification Search
None
See application file for complete search history.

(56) References Cited

U.S. PATENT DOCUMENTS

| | | | | |
|---|---|---|---|---|
| 5,914,906 A * | 6/1999 | Iadanza | ............... | G11C 7/1006 365/189.08 |
| 2006/0233012 A1* | 10/2006 | Sekiguchi | ............... | G11C 5/02 365/51 |
| 2012/0063194 A1* | 3/2012 | Baek | ............... | H01L 45/147 257/E45.002 |
| 2012/0243294 A1* | 9/2012 | Kaneko | ............... | G11C 13/0069 365/148 |
| 2015/0085567 A1* | 3/2015 | Wang | ............... | G11C 11/412 438/106 |
| 2015/0162052 A1* | 6/2015 | Huang | ............... | H01L 21/8234 438/197 |
| 2015/0302919 A1* | 10/2015 | Xie | ............... | H01L 27/1108 438/107 |
| 2016/0276019 A9 | 9/2016 | Lin et al. | | |
| 2017/0148507 A1 | 5/2017 | Chan et al. | | |

OTHER PUBLICATIONS

Xu, et al.; Enhanced 3D Implementation of an Arm® Cortex®—A Microprocessor; 2019 ISLPED; Jul. 2019.
England, et al.; Advanced Packaging Saves the Day!—How TSV Technology Will Enable Continued Scaling; 2017 IEDM; Dec. 2017.
Jouve, et al.; 1µm Pitch Direct Hybrid Bonding With <300nm Wafer-to-Wafer Overlay Accuracy; 2017 S3S; Oct. 2017.
Kong, et al.; Architecting Large-Scale SRAM Arrays with Monolithic 3D Integration; 2017 ISLPED; Jul. 2017.

(Continued)

*Primary Examiner* — Tan T. Nguyen
(74) *Attorney, Agent, or Firm* — Pramudji Law Group PLLC; Ari Pramudji

(57) ABSTRACT

According to one implementation of the present disclosure, an integrated circuit comprises a memory macro unit that includes an input/output (I/O) circuit block, where read/write circuitry of the I/O circuit block is apportioned on at least first and second tiers of the memory macro unit. In a particular implementation, read circuitry of the read/write circuitry is arranged on the first tier and write circuitry of the read/write circuitry is arranged on the second tier.

16 Claims, 11 Drawing Sheets

(56) References Cited

OTHER PUBLICATIONS

Chang, et al.; Cascade2D: A Design-Aware Partitioning Approach to Monolithic 3D IC with 2D Commercial Tools; 2016 ICCAD; Nov. 2016.
Chang, et al.; Match-Making for Monolithic 3D IC: Finding the Right Technology Node; 53rd DAC; Jun. 2016.
Batude, et al.; 3DVLSI with CoolCube Process: An Alternative Path to Scaling; 2015 VLSI Technology; Jun. 2015.
Inoue, et al.; 3D Implemented SRAM/DRAM Hybrid Cache Architecture for High-Performance and Low Power Consumption; 54th MWSCAS; Aug. 2011.
Hsu, et al.; High-Performance 3D-SRAM Architecture Design; Asia Pacific Conference on Circuits and Systems; Dec. 2010.
Funaya, et al.; Cache Partitioning Strategies for 3-D Stacked Vector Processors; 2010 3DIC; Nov. 2010.
Puttaswamy, et al.; 3D-Integrated SRAM Components for High-Performance Microprocessors; IEEE Transactions on Computers; vol. 58, Issue 10; Oct. 2009.
Chen, et al.; Delay Analysis and Design Exploration for 3D SRAM; 2009 International Conference on 3D System Integration; Sep. 2009.
Nho, et al.; A High-Speed, Low-Power 3D-SRAM Architecture; IEEE Custom Integrated Circuits Conference; Sep. 2008.
Tsai, et al.; Design Space Exploration for 3-D Cache; IEEE VLSI Systems; vol. 16, Issue 4; Apr. 2008.
PCT International Search Report and Written Opinion; PCT/GB2022/050057; dated Apr. 21, 2022.

* cited by examiner

CIRCUITRY APPORTIONING OF AN INTEGRATED CIRCUIT

I. FIELD

The present disclosure is generally related to circuitry apportioning for a multi-tiered memory macro unit of an integrated circuit and methods thereof.

II. DESCRIPTION OF RELATED ART

Advances in technology have resulted in smaller and more powerful computing devices. For example, a variety of personal computing devices, including wireless telephones, such as mobile and smart phones, gaming consoles, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities. However, for such devices, there is an ever-increasing demand for greater area efficiency for memory storage capacity and read/write capabilities. For instance, large memories or caches are required by state-of-the-art microprocessors to fulfill such demands in modern applications.

Nevertheless, at present, performance, power, area, and cost (PPAC) benefits of digital integrated circuits of such large memories at scaled technologies are diminishing due to increasing interconnect parasitics, placement congestion from hyper-scaled standard cells, device electrostatics, and expensive multiple patterning technologies. Hence there is a need in the art for design techniques to alleviate such issues.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Figure 1:
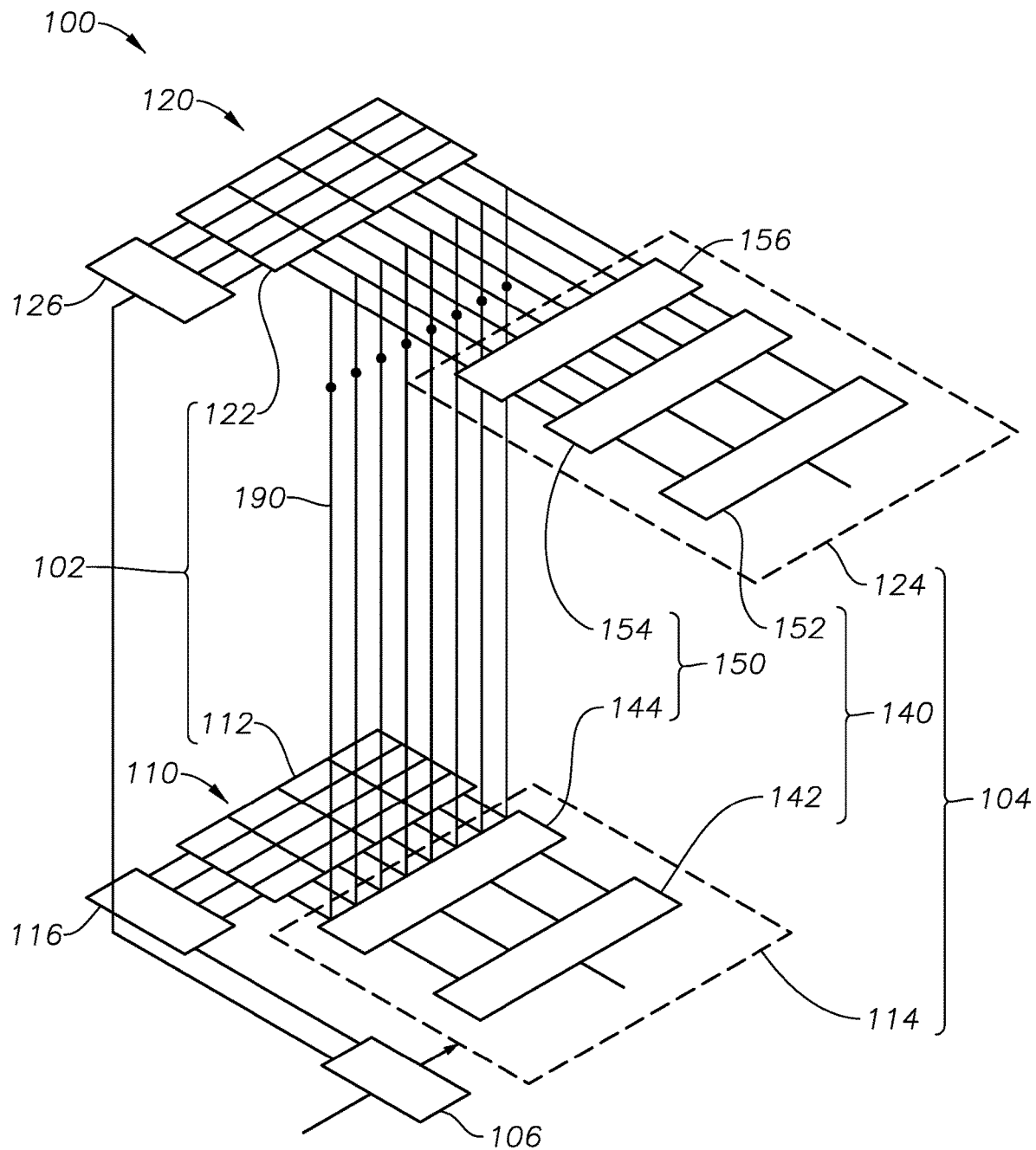
FIG. 1 is a diagram of a portion of an example integrated circuit in accordance with various implementations described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

Particular implementations of the present disclosure are described below with reference to the drawings. In the description, common features are designated by common reference numbers throughout the drawings.

According to one implementation of the present disclosure, an integrated circuit includes a memory macro unit including an input/output (I/O) circuit block, where read/write circuitry (read/write data path, read/write components) of the I/O circuit block is apportioned (e.g., "split", divided, folded, allocated, arranged) on at least first and second tiers of the memory macro unit.

According to one implementation of the present disclosure, a method for apportioning an I/O block of a 3D memory macro unit) comprises: 1) receiving a user input corresponding to dimensions of first and second tiers and respective pitches of one or more 3D connections; 2) determining whether dimensions of a multi-tier memory macro unit is greater than a size threshold, where the size threshold corresponds to the received user input; and 3) determining a multi-tier memory macro design based on the determined dimensions of the multi-tier memory macro unit.

According to one implementation of the present disclosure, an integrated circuit includes a memory macro unit including an input/output (I/O) circuit block, where a read circuit is arranged on a first tier of the memory macro unit and a write circuit is arranged on a second tier of the memory macro unit.

The above-described issues may be alleviated through three-dimensional (3D) vertical integration. Hence, in certain solutions, the inventive aspects provide for one single memory macro unit that can be "folded" (e.g., split, divided, apportioned, allocated) across two tiers of a 3D static random-access memory (SRAM). As one advantage, each of the two tiers would have a smaller footprint as a result of the folding. In certain implementations, an Input/Output (I/O) unit block (i.e., a single I/O circuitry) of the single memory macro unit may be "intelligently" folded so as to maximize the benefits of such an apportioning. Advantageously, such inventive aspects may include asymmetrical splits of the 3D architecture, providing for more "relaxed" 3D connection pitch requirements due to minimal 3D connections (i.e., inter-tier vias) and more efficient overall density.

Certain definitions have been provided herein for reference. The term "macro" and "instance" have been utilized interchangeably—as in what is delivered from a memory compiler. A "macro" may have "butterfly architecture" (but not required), may be split into "banks", "column-multiplexing", and/or various other design features (e.g., power gating, redundancy, write mask) as per the decisions of a macro unit's (e.g., SRAM's) "architecture". An instance may be "single-banked" or "multi-banked". Also, each bank is a nearly-complete subset of the memory instance. And a large instance may be broken down into "smaller chunks" (each with separate control, word-line drivers, bit-cell array, input/output circuitry) for substantially performance and power reasons. For a particular "architecture", the "instance" can have varying number of rows, columns, and banks to achieve the desired capacity. Multiple "instances" can be stitched together to implement a cache at a system-on-chip (SoC) level. Column multiplexers (or column mux) may be provided as separate from the input/output (I/O) circuitry, while the I/O circuitry may include several other blocks, including a sense amplifier, a write driver, and precharge circuitry.

Referring to FIGS. 1-9, example diagrams of a portion of an SRAM macro is shown. According to the inventive aspects, the below following cases (i.e., example floor plans) describe how respective I/O circuitry blocks may be optimally divided into different tiers.

Referring to FIG. 1, an example portion of a divisible multi-tier memory macro unit 100 (e.g., static random-access memory (S-RAM) memory macro section implementable on a three-dimensional (3D) integrated circuit (IC) (e.g., the system-on-chip (SoC)) is shown. In certain implementations, the multi-tier macro unit 100 may include at least a bitcell array 102 (e.g., six-transistor (6T) memory array) (i.e., one or more bitcell sub-arrays, one or more core arrays, memory arrays) and an input/output circuitry block 104 (i.e., a I/O circuitry, a single I/O block). As illustrated in the example portion, the memory macro unit 100 may include at least first and second tiers 110, 120 (i.e., first and second "layers" of the 3D IC), where each tier (e.g., 110, 120) includes respective bitcell sub-arrays 112, 122 (or portions of one bitcell array 102) and respective I/O circuitry (portions) 114, 124 (of the I/O circuitry block 104). Also, each of the respective I/O circuitry (portions) 114, 124 may include read/write (i.e., read and/or write) circuitry 140 (e.g., 142, 152) (i.e., read and/or write data paths, read and/or write data components) and column multiplexers 150 (e.g., read column multiplexer 144 of the first tier 110, write column multiplexer 154 of the second tier 120). Accordingly, in such implementations as described herein, the read/write circuitry 140 of the I/O circuitry block 104 may be apportioned (e.g., split, divided) on the first and second tiers 110, 120 (i.e., first and second "layers" of the 3D IC, different tiers). Advantageously, in certain cases, the I/O circuitry block 104 may be "intelligently split" such that circuitry related to "data in" (e.g., logic that drives the "D" pin (data and write mask pins)) may be apportioned on one tier, while all circuitry related to "data out" (e.g., logic that drives the "Q" pin, read data) may be apportioned on the other tier. Moreover, such an I/O circuit block 104 may be configured to transmit signals between the bitcell array 102 (e.g., first and second bitcell sub-arrays 112, 122) and boundaries of the 3D memory macro unit 100.

As depicted in FIG. 1, the portion of the memory macro unit 100 (e.g., core array structure, "floor plan") may further include: a control circuitry (i.e., a control block) 106, first and second row decoders 116, 126 (i.e., first and second word-line decoder blocks, first and second word-line drivers) coupled to the bitcell sub-arrays 112, 122 (i.e., first and second bitcell sub-arrays, two or more bitcell sub-arrays). For example, the control block 110 may be coupled to the first and second bitcell sub-arrays 112, 122, the respective I/O circuitry 114, 124, and the first and second row decoders 116, 126. In certain cases, the control block 106 and the first row decoders 116 may be arranged on the first tier 110, while the second row decoders 126 may be arranged on the second tier 120. In various implementations, a control signal from the control block 106 may be transmitted to hundreds of I/O circuit blocks 104 (e.g., 64 or 128 I/O blocks). (e.g., in multiples of four bitcell columns transmitted to a 4-input, 1-output multiplexer) (i.e., a mux4 design).

In one example implementation, with reference to FIG. 1, the respective I/O circuitry 114 of the first tier 110 may include read circuitry 142 and read column multiplexers 144. Also, the respective I/O circuitry 124 of the second tier 120 may include write circuitry 152, write column multiplexers 154, and precharge circuitry 156. Accordingly, in such an implementation as illustrated in FIG. 1, the read/write circuitry 140 may be arranged such that read circuitry 142 of the read/write circuitry 140 is apportioned on the first tier 110, while write circuitry 152 of the read/write circuitry 140 is apportioned on the second tier 120. In such an implementation, bitcell sub-arrays of both the first and second tiers share read and write logic on both tiers. In another example implementation (not shown), the precharge circuitry 156 may be included on the first tier 110 between the first bitcell subarray 112 and the read circuitry 142 (instead of on the second tier 120 as illustrated).

Advantageously, in an example implementation, as depicted in FIG. 1, in case of a mux4 design (i.e., 4 columns per IO) using 6T bitcells (i.e., with 2 bitlines per column), eight 3D connections (i.e., multi-tier connections, inter-tier vias (ITVs)) 190 may be transmitted across the first and second tiers 110, 120 for read and write operations. For example, as shown in FIG. 1, the multi-tier connections 190 are transmitted vertically between the respective bitcell sub-arrays 112, 122 and respective I/O circuitry 114, 124 of each horizontal tier 110, 120. In such an implementation, as a 6T SRAM may include four bitcell columns in a mux4 design (e.g., 112, 122 as shown in FIG. 2), eight signals 190 (i.e., two (bitline (bl), complementary bitline (nbl)) for each of the four bitcell columns) are transmitted vertically as 3D connections between the first and second tiers 110, 120.

Figure 2:
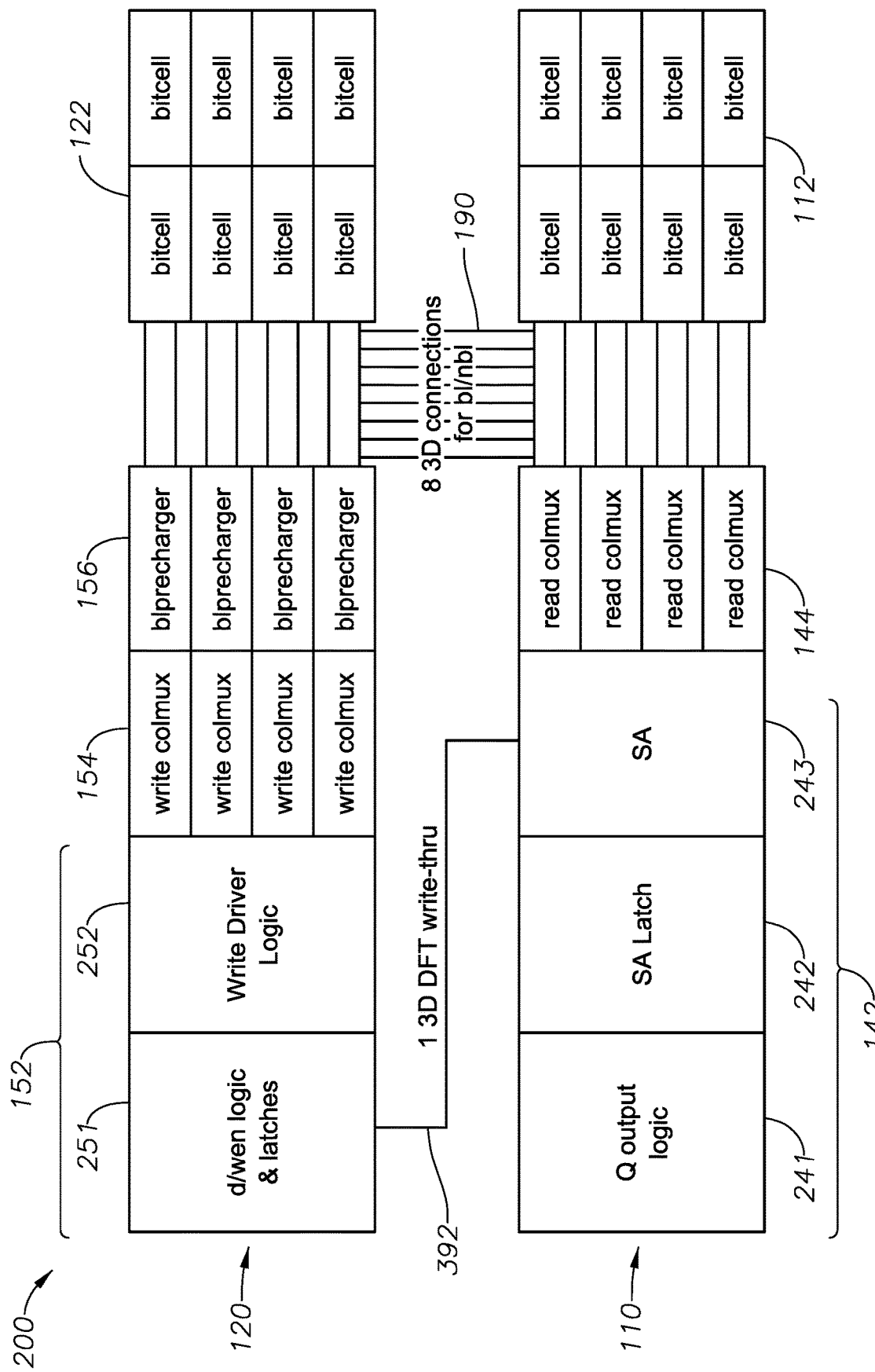
FIG. 2 is a diagram of a portion of an example integrated circuit in accordance with various implementations described herein.

Referring to FIG. 2, an example block diagram 200 corresponding to the portion of the 3D floorplan in FIG. 1 is shown. As illustrated, on the first tier 110 (e.g., a bottom tier) the memory macro unit 100 includes: the read circuitry 142 (including output logic circuitry 241 (i.e., "Q" pin output logic), latch circuitry 242 (i.e., sense amplifier latch circuitry), and sense amplifier 243); a column multiplexer 144 (i.e., (e.g., respective read column multiplexers for each bitcell column of the respective tier); and the first bitcell sub-array 112. Also, as shown, on the second tier 120 (e.g., a top tier) the memory macro unit 100 includes: the write circuitry 152 (including the input latch circuitry 251 (i.e., latch circuitry, d/wen ("D" pin/write enable) logic and latches) and write driver logic 252) write column multiplexer 154 (e.g., respective write column multiplexers for each bitcell column of the respective tier), the precharge circuitry 156 (i.e., bitline precharge circuitry), and the second bitcell sub-array 122. While the example block diagram 200 illustrates the precharge circuitry 156 on the second tier, in another implementation, the precharge circuitry 156 may be included on the first tier 110 instead.

As illustrated in FIG. 2, the 8 3D connections 190 may be transmitted on read and write paths before either of the read or write column multiplexers (i.e., the connections 190 are transmitted "pre-mux"). Hence, 8 3D connections would be configured to run vertically between the two tiers 110, 120 for read and write operations. Advantageously, in such an implementation, a single multi-tier connection is configured for each bitline between the first and second tiers of the memory macro unit.

Figure 3:
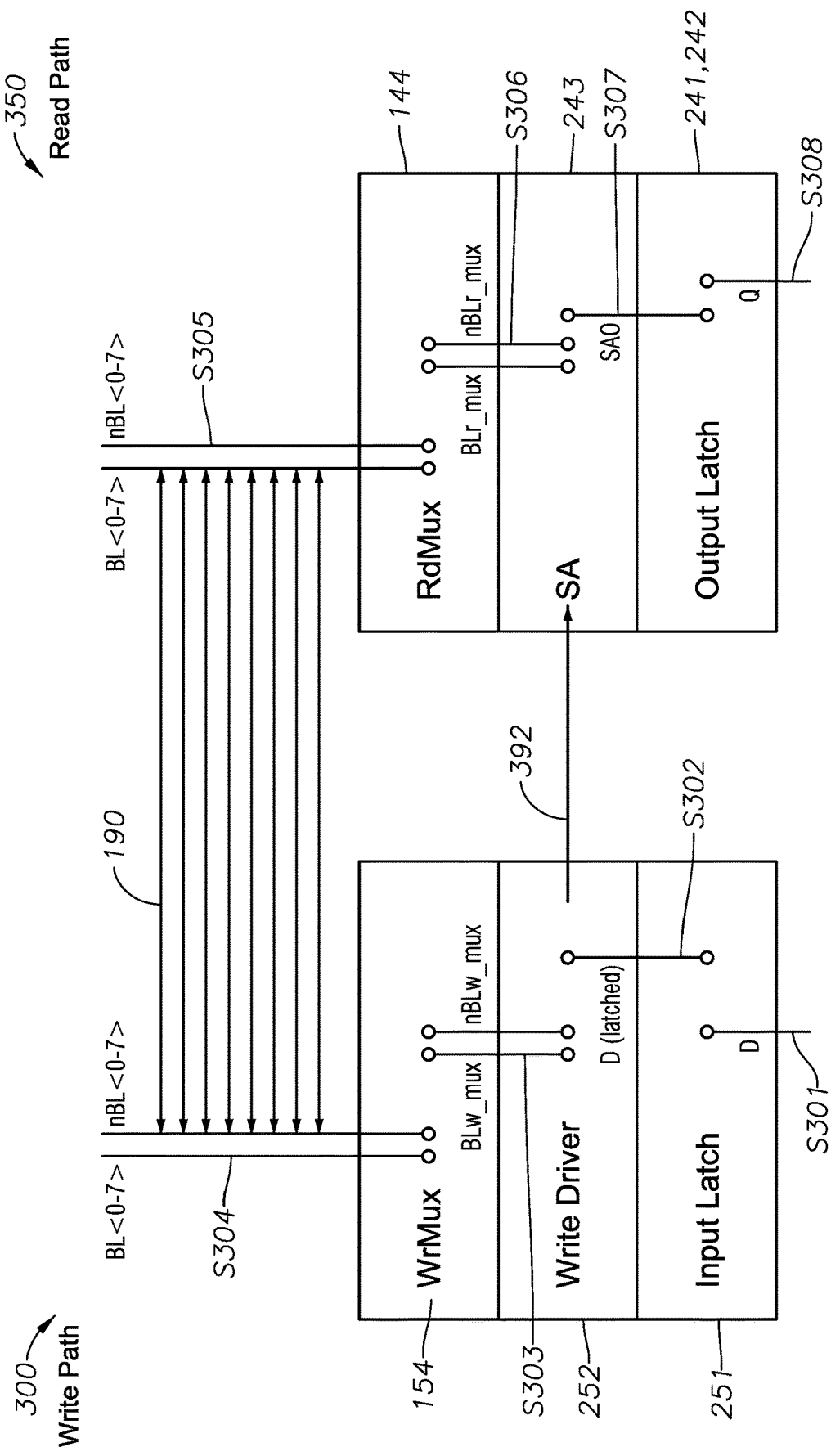
FIG. 3 is a diagram of a portion of an example integrated circuit in accordance with various implementations described herein.

Referring to FIG. 3, an example write data path 300 and an example read data path (350 on an example "floor plan" of the I/O block implementable with the memory macro unit 100 (as described in FIGS. 1 and 2) are shown. As depicted for the write data path 300 for write operation, at step 301 (the term "step" denoted as S and the reference numeral throughout, e.g., S301), from outside of the memory macro unit, a "D" input signal (data and write mask pins) may be transmitted to the input latch circuitry 251 (i.e., latch circuitry) of the write circuit 152. Next, at step 302, the input latch circuitry 251 (i.e., latch circuitry) may output a latched version of the D signal to the write driver logic 252. At step 303, from the write driver drive logic 252, each of a BLw_mux signal (i.e., bitline write multiplexer signal) and a complement nBLw_mux signal (i.e., complement bitline write multiplexer signal) may be transferred to the write multiplexer 154 (i.e., write column multiplexer). Next, at step 304, the corresponding write signals (e.g., BL <0-7>, nBL <0-7>) may be transmitted through the precharge circuitry 156 (of the second tier 120) and to the first or second bitcell sub-arrays 112, 122 for write operations.

With reference to the read data path (300) for read operation, at step 305, read signals (e.g., BL <0-7>, nBL <0-7>) may be transmitted from either the first or second bitcell sub-arrays 112, 122 to the read multiplexers 144 (i.e., read column multiplexers). At step 306, each of a BLr_mux signal (i.e., bitline read multiplexer signal) and a complement nBLr_mux signal (i.e., complement bitline read multiplexer signal) may be transferred from the read multiplexers 154 to the sense amplifier 243 of the read circuit 142. Next, at step 307, from the sense amplifier 243, a resultant sense amplifier output signal (SAO) may be transmitted to the output latch (including sense amplifier latch 242 and Q output logic 241) of the read circuit 142. Lastly, at step 308, a "Q" output signal is transmitted out of the memory macro unit 100.

Of note, with reference to the example of FIG. 3, the 8 3D connections 190 are transmitted between the first and second tiers 110, 120 "pre-mux", and thus, in this example, two connections each are made for bl and nbl for each of the four bitcell columns. Advantageously, such 3D connections allow for read and write logic sharing between the multiple tiers.

As another feature, with reference to FIGS. 1-3, a design-for-test 392 (DFT) 3D connection pin may be configured.

The DFT 392 can be used to test the logic outside of an SRAM bitcell by connecting between the "D" latched signal from the input latch 251 of the write circuitry 152 and directly into the sense amplifier 243 of read circuitry 142 and output as the sense amplifier output (SAO) signal. Advantageously, in doing so, the DFT 392 may be configured to provide accurate "by-pass" outside-of-SRAM testing without any potential corruption due to errors of the SRAM bitcell itself.

Figure 4:
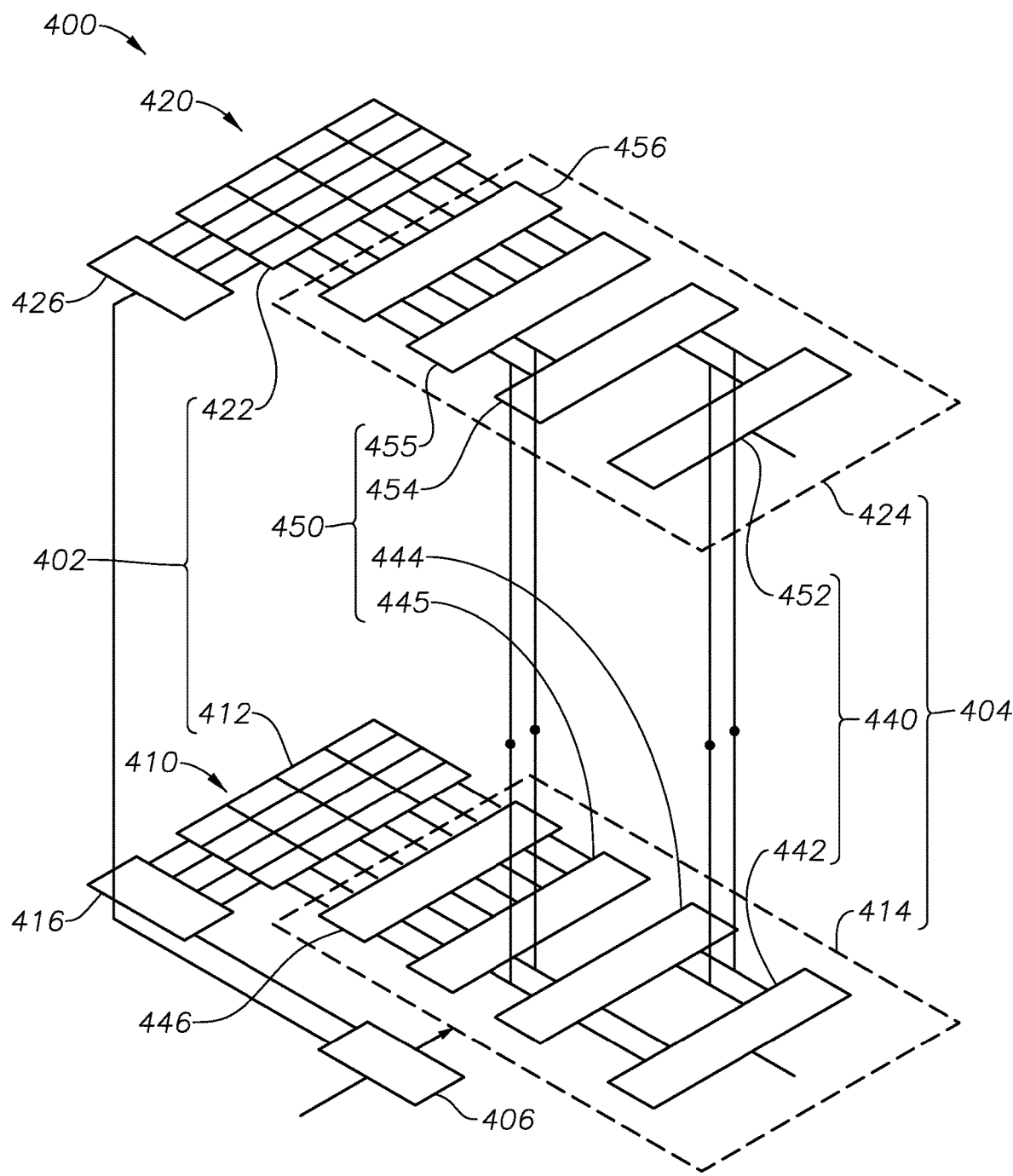
FIG. 4 is a diagram of a portion of an example integrated circuit in accordance with various implementations described herein.

Referring to FIG. 4, an example portion of a divisible multi-tier memory macro unit 400 (e.g., static random-access memory (S-RAM) memory macro section implementable on a three-dimensional (3D) integrated circuit (IC) (e.g., the system-on-chip (SoC)) is shown. In certain implementations, the multi-tier macro unit 400 may include at least a bitcell array 402 (e.g., one or more bitcell sub-arrays, one or more core arrays, memory arrays) and an input/output circuit block 404 (i.e., I/O circuitry, a single I/O block). As illustrated in the example portion, the memory macro unit 400 may include at least first and second tiers 410, 420 (i.e., first and second "layers" of the 3D IC), where each tier (e.g., 410, 420) includes respective bitcell sub-arrays 412, 422 (or portions of one bitcell array 402) and respective I/O circuitry (portions) 414, 424 (of the I/O circuitry 404). Also, each of the respective I/O circuitry (portions) 414, 424 may include read/write (i.e., read and/or write) circuitry 440 (e.g., 442, 452) (i.e., read and write data paths, read and write data components), column multiplexers 450 (i.e., both read and write column multiplexers 445, 444 455, 454 for each of the first and second tiers 410, 420), and respective pre-charge circuitry (446, 456). Accordingly, in such implementations as described herein, the read/write circuitry 440 of the I/O circuit block 404 may be arranged (e.g., split, divided) on both the first and second tiers 410, 420 (i.e., first and second "layers" of the 3D IC, different tiers). Advantageously, in certain cases, the I/O circuitry block 104 may be "intelligently split" such that circuitry related to "data in" (e.g., logic that drives the "D" pin, (data and write mask pins)) may be apportioned on one tier, while all circuitry related to "data out" (e.g., logic that drives the "Q" pin, read data) may be apportioned on the other tier. Advantageously, such an I/O circuit block 404 may be configured to transmit signals between the bitcell array 402 (e.g., first and second bitcell sub-arrays 412, 414) and both upper and lower boundaries of the 3D memory macro unit 400.

Similar to as depicted with the memory macro unit 100, the portion of the memory macro unit 400 (e.g., core array structure, "floor plan") may further include: a control circuitry (i.e., a control block) 406, first and second row decoders 416, 426 (i.e., first and second word-line decoder blocks, first and second word-line drivers) coupled to the bitcell sub-arrays 412, 422 (i.e., first and second bitcell arrays, two or more bitcell sub-arrays). For example, the control block 406 may be coupled to the first and second bitcell sub-arrays 412, 422, the respective I/O circuitry 414, 424, and the first and second row decoders 416, 426. In certain cases, the control block 406 and the first row decoders 416 may be arranged on the first tier 410, while the second row decoders 426 may be arranged on the second tier 420. In various implementations, a control signal from the control block 406 may be transmitted to hundreds of I/O circuit blocks 404 (e.g., multiples of four bitcell columns such as 64 or 128 I/O blocks).

In one implementation, with reference to FIG. 4, the respective I/O circuitry 414 of the first tier 410 may include read circuitry 442, a respective write column multiplexer 444 (i.e., a first write column multiplexer), a respective read column multiplexer 445 (i.e., a first read column multiplexer), and a respective pre-charge circuitry 446 (i.e., a first pre-charge circuitry). Also, the respective I/O circuitry 424 of the second tier 424 may include write circuitry 452, a respective write column multiplexer 454 (i.e., a second write column multiplexer), a respective read column multiplexer 455 (i.e., a second read column multiplexer), and a respective precharge circuitry 456 (i.e., a second pre-charge circuitry). Accordingly, like the read/write circuitry of FIG. 1, the read/write circuitry 140 in FIG. 4 may be arranged such that read circuitry 142 of the read/write circuitry 140 is apportioned on the first tier 110, while write circuitry 152 of the read/write circuitry 140 is apportioned on the second tier 120.

However, in contrast to FIG. 1, the implementation of FIG. 4 may include both read and write column multiplexers 444, 445, 454, 455 on each of the first and second tiers 410, 420. Advantageously, in such an implementation, as depicted in FIG. 4, four 3D connections (i.e., multi-tier connections, inter-tier vias (ITVs)) 490 may be transmitted between the first and second tiers 410, 420 for both read and write operations. Moreover, as shown in FIG. 4, two of the multi-tier connections 490 may be transmitted vertically after the first or second read column multiplexers 445, 455 (i.e., "post-mux") and after the first or second write column multiplexer 444, 454 ("post-mux") before the read and write circuitry 442, 444. Hence, in contrast to FIG. 1, as FIG. 4 is "post-mux", the eight 3D connections are reduced to two selected connections each for read (i.e., SD and complement NSD) and for write (i.e., WDL (write data line) and complement NWDL) operations. As an advantage, as less 3D connections would be needed for such an implementation, the pitch constraint (i.e., the closest distance from one connection to the next to be reliably fabricated) between the first and second tiers 410, 420 may be lessened from a design perspective.

Figure 5:
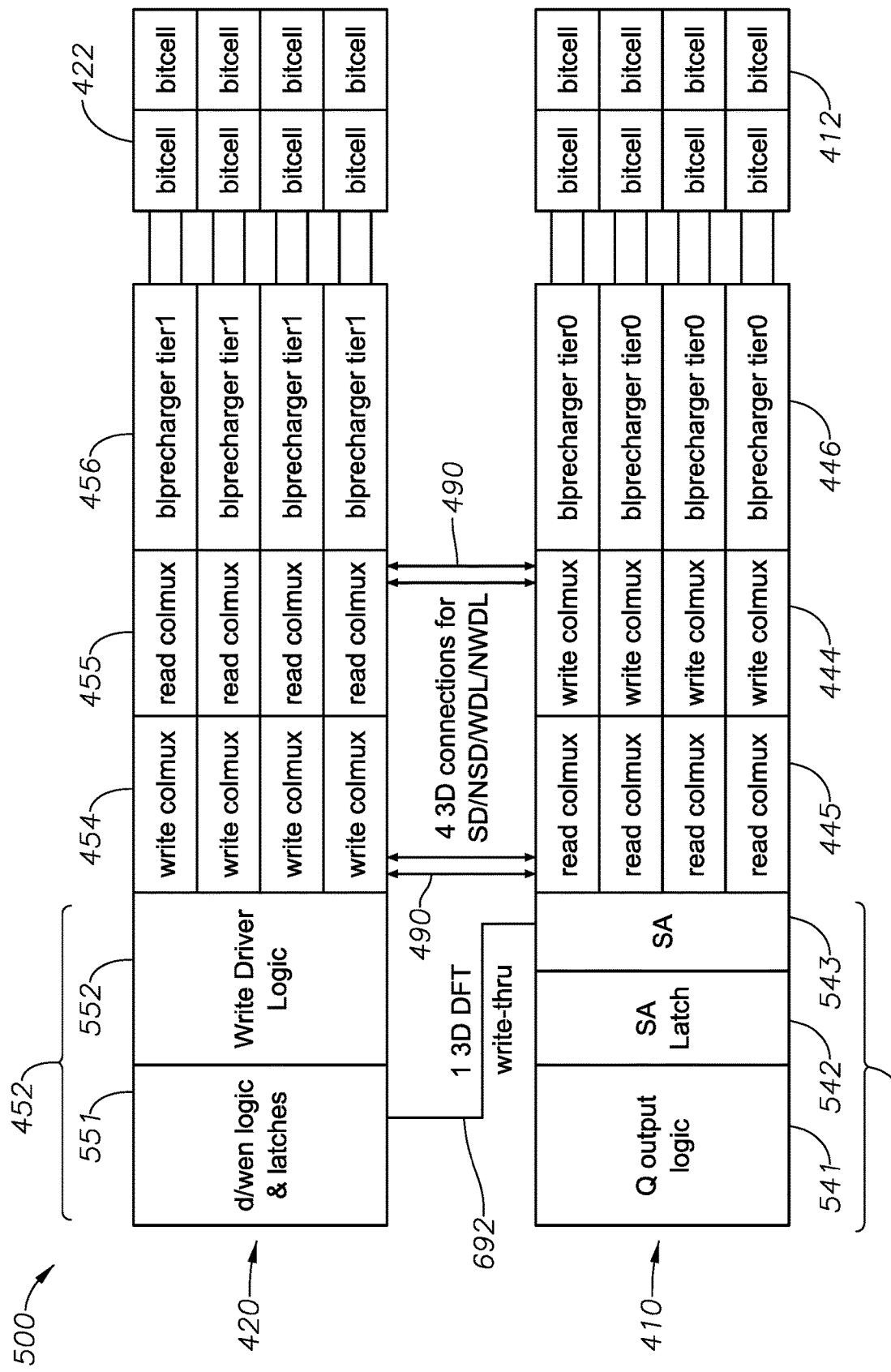
FIG. 5 is a diagram of a portion of an example integrated circuit in accordance with various implementations described herein.

Referring to FIG. 5, an example block diagram 500 corresponding to the portion of the 3D floorplan in FIG. 4 is shown. As illustrated, on the first tier 410 (e.g., a bottom tier) the memory macro unit 400 includes: the read circuitry 442 (including output logic circuitry 541 (i.e., "Q" output logic), latch circuitry 542 (i.e., sense amplifier latch circuitry), and sense amplifier 543); the first read column multiplexer(s) 445 (e.g., respective read column multiplexers for each bitcell column of the respective tier); the first write column multiplexer(s) 444 (e.g., respective write column multiplexers for each bitcell column of the respective tier), and the first pre-charge circuitry 446 (i.e., respective bitline pre-charge circuitry for each bitcell column of the respective tier); and the first bitcell sub-array 412.

Also, as shown, on the second tier 420 (e.g., a top tier) the memory macro unit 400 includes: the write circuitry 452 (including the input latch circuitry 551 (i.e., latch circuitry, d/wen logic and latches) and write driver logic 552), the second write column multiplexer(s) 454 (i.e., respective write column multiplexers for each bitcell column of the respective tier), the second read column multiplexer(s) 455 (i.e., respective read column multiplexers for each bitcell column of the respective tier), the second precharge circuitry 456 (i.e., respective bitline precharge circuitry for each bitcell column of the respective tier), and the second bitcell sub-array 422.

As illustrated in FIG. 5, the 4 3D connections 490 are transmitted on read and write paths after the read or write column multiplexers on each tier (i.e., the connections 190 are transmitted "post-mux"). Hence, in this example, just four 3D connections 490 would be configured to run vertically between the two tiers 410, 420 for read and write operations. Advantageously, in such an implementation, a single multi-tier connection can be configured for each post-multiplexed bitline between the first and second tiers of the memory macro unit.

Figure 6:
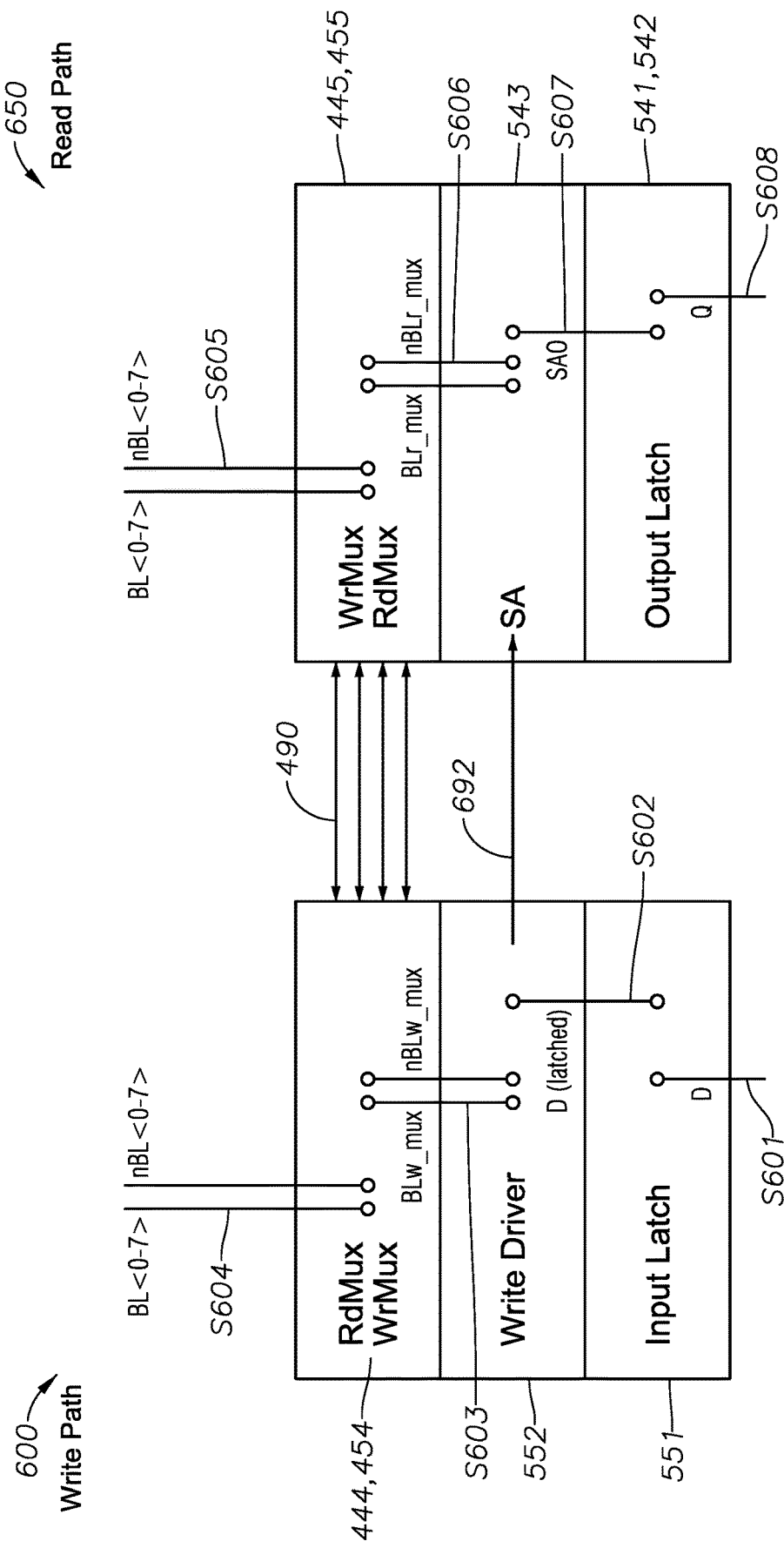
FIG. 6 is a diagram of a portion of an example integrated circuit in accordance with various implementations described herein.

Referring to FIG. 6, an example write data path 600 and an example read data path 650 on an example "floor plan" of the I/O block implementable with the memory macro unit 400 (as described in FIGS. 4 and 5) are shown. As depicted for the write data path 600 for write operation, at step 601, from outside of the memory macro unit, a "D" input signal (data and write mask pins) may be transmitted to the input latch circuitry 551 (i.e., latch circuitry) of the write circuit 452. Next, at step 602, the input latch circuitry 551 may output a latched version of the "D" signal to the write driver logic 552. At step 603, from the write driver drive logic 552, each of a BLw_mux signal (i.e., bitline write multiplexer signal) and a complement nBLw_mux signal (i.e., complement bitline write multiplexer signal) may be transferred to the first or the second write multiplexers 444, 554 (i.e., write column multiplexers on the first or the second tier 410, 420). Next, at step 604, the corresponding write signals (e.g., BL <0-7>, nBL <0-7>) may be transmitted through either the first or second precharge circuitry 446, 456 and to the first and second bitcell sub-arrays 412, 422 for write operations.

With reference to the read data path (650) for read operation, at step 605, read signals (e.g., BL <0-7>, nBL <0-7>) may be transmitted from either the first or second bitcell sub-arrays 412, 422 through the respective first or second precharge circuitry 446, 456 to either of the first or second read multiplexers 444, 454 (i.e., read column multiplexers) of the first and second tiers 410, 420. At step 606, each of a BLr_mux signal (i.e., bitline read multiplexer signal) and a complement nBLr_mux signal (i.e., complement bitline read multiplexer signal) may be transferred from one of the read multiplexers 445, 455 to the sense amplifier 543 of the read circuit 442. Next, at step 607, from the sense amplifier 543, a resultant sense amplifier output signal (SAO) may be transmitted to the output latch (including sense amplifier latch 542 and Q output logic 541) of the read circuit 442. Lastly, at step 608, a "Q" output signal is transmitted out of the memory macro unit 400.

Of note, with reference to the example of FIG. 6, four 3D connections 490 are transmitted between the first and second tiers 110, 120 "post-mux". Hence, in this example, two connections each (i.e., two selected pairs) are made for the read data lines (SD, NSD) and for the write data lines (WDL, NWDL) for a total of four 3D connections 490. Advantageously, such 3D connections allow for read and write logic sharing between the multiple tiers.

As another feature, with reference to FIGS. 4-6, a design-for-test 692 (DFT) 3D connection pin may be configured. The DFT 692 can be used to test the logic outside of an SRAM bitcell by connecting between the "D" latched signal from the input latch 551 of the write circuitry 452 and directly into the sense amplifier 543 of the read circuitry 442 and output as the sense amplifier output (SAO) signal. Advantageously, in doing so, the DFT 692 may be configured to provide accurate "by-pass" outside-of-SRAM testing without any potential corruption due to errors of the SRAM bitcell itself.

Figure 7:
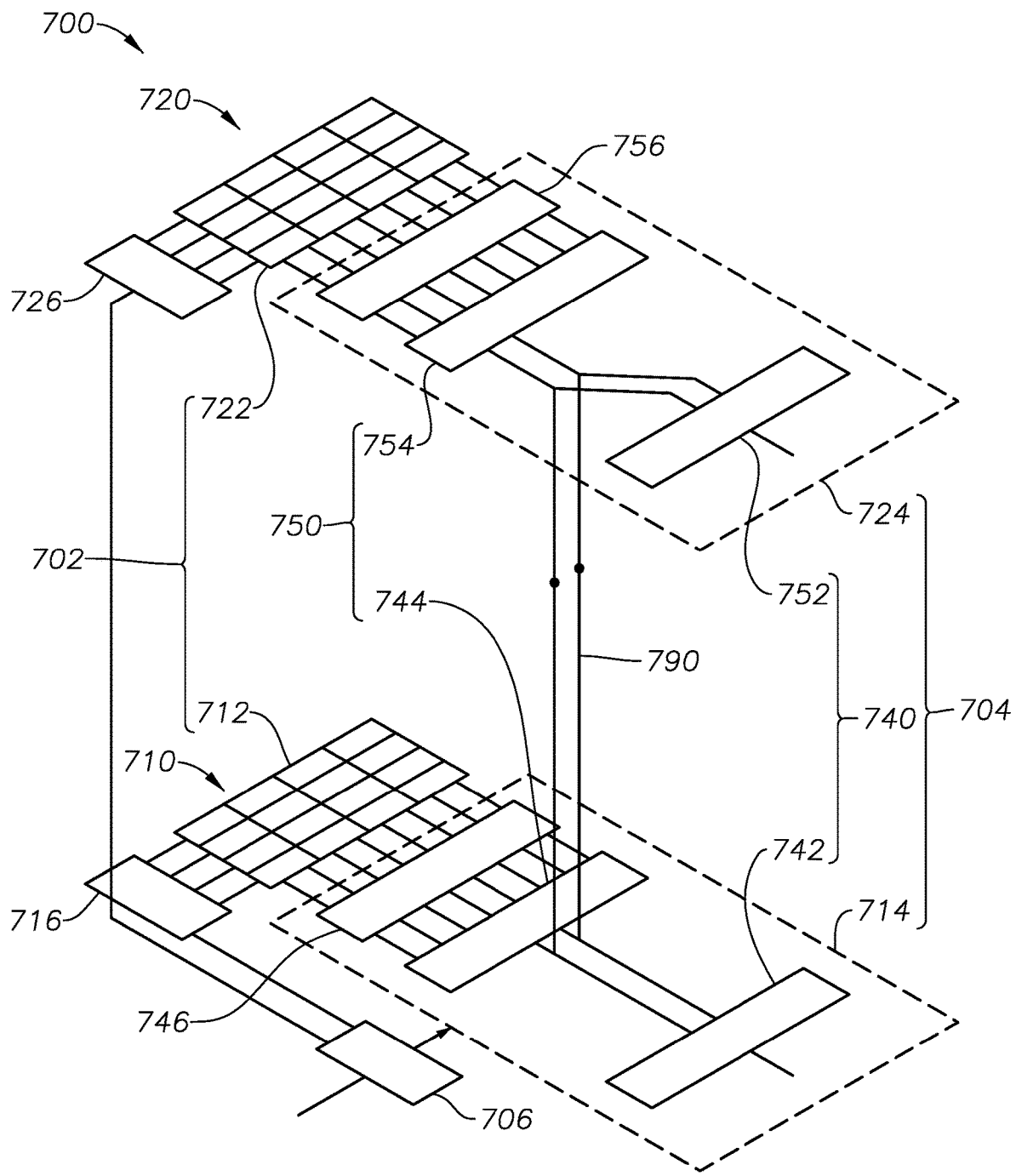
FIG. 7 is a diagram of a portion of an example integrated circuit in accordance with various implementations described herein.

Referring to FIG. 7, an example portion of a divisible multi-tier memory macro unit 700 (e.g., static random-access memory (S-RAM) memory macro section implementable on a three-dimensional (3D) integrated circuit (IC) (e.g., the system-on-chip (SoC)) is shown. In certain implementations, the multi-tier macro unit 700 may include at least a bitcell array 702 (e.g., one or more bitcell sub-arrays, one or more core arrays, memory arrays) and an input/output circuit block 704 (i.e., I/O circuitry, a I/O block). As illustrated in the example portion, the memory macro unit 700 may include at least first and second tiers 710, 720 (i.e., first and second "layers" of the 3D IC), where each tier (e.g., 710, 720) includes respective bitcell sub-arrays 712, 722 (or portions of one bitcell array 702) and respective I/O circuitry (portions) 714, 724 (of the I/O circuitry 404). Also, each of the respective I/O circuitry (portions) 714, 724 may include read/write (i.e., read and write) circuitry 740 (e.g., 742, 752) (i.e., read and write data paths, read and write data components), a respective transmission gate-based multiplexer 750 (i.e., transmission gate) (e.g., transmission gates 744, 754), and respective pre-charge circuitry (e.g., 746, 756). Accordingly, in such implementations as described herein, the read/write circuitry 740 of the I/O circuitry 704 may be arranged (e.g., split, divided) on the first and second tiers 710, 720 (i.e., first and second "layers" of the 3D IC, different tiers). Advantageously, in certain cases, the I/O circuitry block 104 may be "intelligently split" such that circuitry related to "data in" (e.g., logic that drives the "D" pin, (data and write mask pins)) may be apportioned on one tier, while all circuitry related to "data out" (e.g., logic that drives the "Q" pin, read data) may be apportioned on the other tier. Advantageously, such an I/O circuit block 704 may be configured to transmit signals between the bitcell array 702 (e.g., first and second bitcell sub-arrays 712, 722) and both upper and lower boundaries of the 3D memory macro unit 700.

Similar to as depicted with the memory macro unit 100, the portion of the memory macro unit 700 (e.g., core array structure, "floor plan") may further include: a control circuitry (i.e., a control block) 706, first and second row decoders 716, 726 (i.e., first and second word-line decoder blocks, first and second word-line drivers) coupled to the bitcell sub-arrays 712, 722 (i.e., first and second bitcell sub-arrays, two or more bitcell sub-arrays). For example, the control block 710 may be coupled to the first and second bitcell sub-arrays 712, 722, the respective I/O circuitry 714, 724, and the first and second row decoders 716, 726. In certain cases, the control block 706 and the first row decoders 716 may be arranged on the first tier 710, while the second row decoders 726 may be arranged on the second tier 720. In various implementations, a control signal from the control block 706 may be transmitted to hundreds of I/O circuit blocks 704 (e.g., multiples of four bitcell columns such as 64 or 128 I/O blocks).

In one implementation, with reference to FIG. 7, the respective I/O circuitry 714 of the first tier 710 may include read circuitry 742, a respective transmission gate 744 (i.e., a first transmission gate), and a respective pre-charge circuitry 746 (i.e., a first pre-charge circuitry). Also, the respective I/O circuitry 724 of the second tier 724 may include write circuitry 752, a respective transmission gate 754 (i.e., a second transmission gate), and a respective precharge circuitry 456 (i.e., a second pre-charge circuitry). Accordingly, like the read/write circuitry 140, 440 in FIGS. 1 and 4, the read/write circuitry 740 may be arranged such that read circuitry 742 of the read/write circuitry 740 is apportioned on the first tier 710, while write circuitry 752 of the read/write circuitry 740 is apportioned on the second tier 720.

However, in contrast to FIGS. 1 and 4, the implementation of FIG. 7 includes a transmission gate-based multiplexer (e.g., first and second transmission gates 744, 754) (i.e., combination read/write column multiplexer(s)) on each of the first and second tiers 710, 720. Advantageously, in a third example implementation, as depicted in FIG. 7, just two 3D connections (i.e., multi-tier connections, inter-tier vias (ITVs))) 790 may be transmitted between the first and second tiers 710, 720 for both read and write operations. Accordingly, as shown in FIG. 7, the two multi-tier connections 790 may be transmitted vertically between (i.e., "after") the first and second transmission gates 744, 754 and the read circuitry 742 of the I/O circuitry 714 on the first horizontal tier 710 and the second first transmission gate 745 and the write circuitry 752 of the I/O circuitry 724 on the second horizontal tier 720.

In certain implementations, the merging of write and read column select signals (e.g., signals in the transmission gate-based multiplexer implementations as described herein) may simplify generation logic in the memory control block 706. Advantageously, such simplified generation logic would ease routing congestion from the memory control block 706 to the memory I/O block 704.

Figure 8:
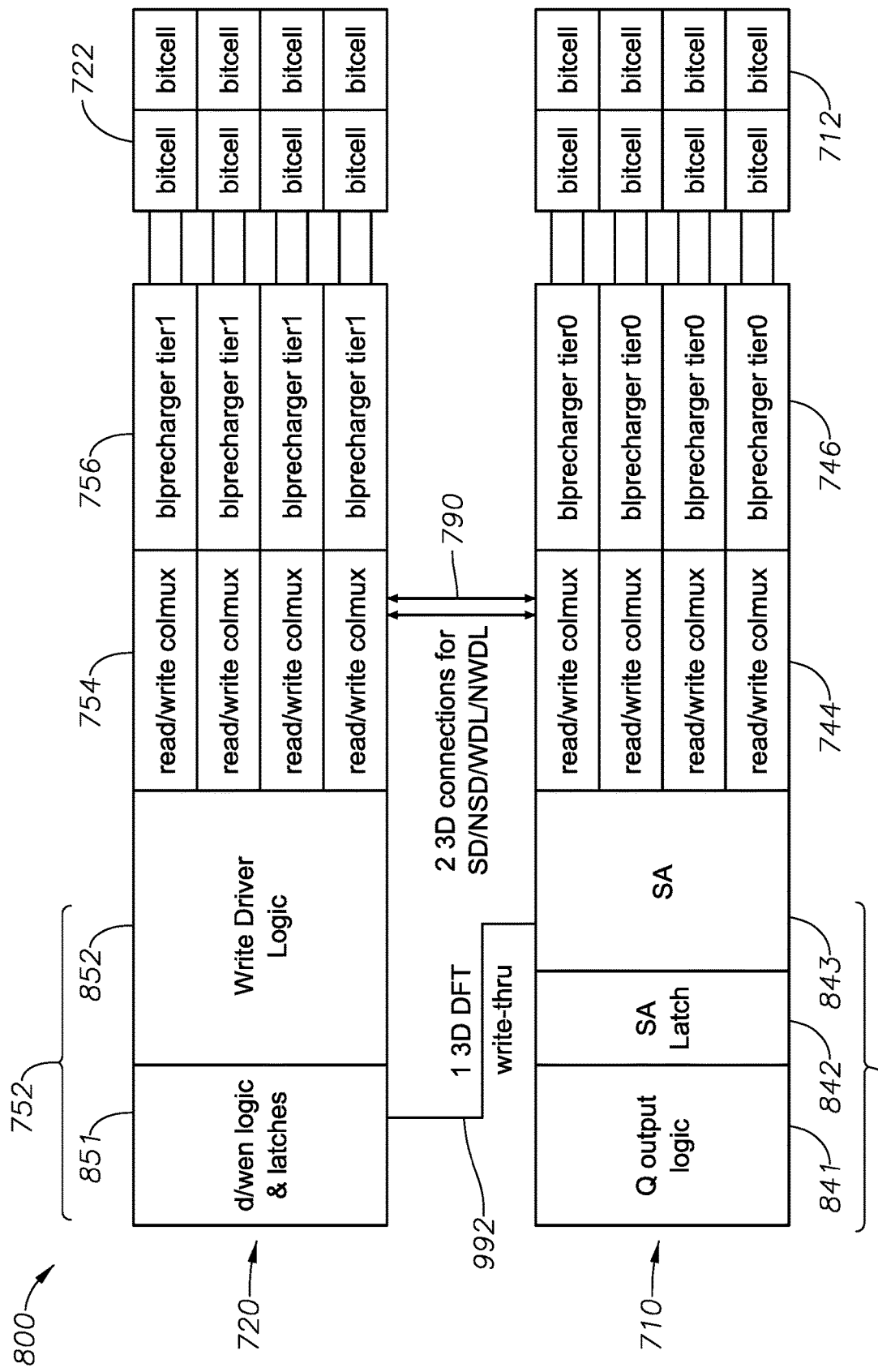
FIG. 8 is a diagram of a portion of an example integrated circuit in accordance with various implementations described herein.

Referring to FIG. 8, an example block diagram 800 corresponding to the portion of the 3D floorplan 700 in FIG. 7 is shown. As illustrated, on the first tier 710 (e.g., a bottom tier) the memory macro unit 700 includes: the read circuitry 742 (including output logic circuitry 841 (i.e., "Q" output logic), latch circuitry 842 (i.e., sense amplifier latch circuitry), and sense amplifier 843); the first transmission gate(s) 744 (e.g., respective first transmission gates for each bitcell column of the respective tier); the first pre-charge circuitry 746 (i.e., respective bitline precharge circuitry for each bitcell column of the respective tier); and the first bitcell sub-array 712.

Also, as shown on the second tier 720 (e.g., a top tier), the memory macro unit 700 includes: the write circuitry 752 (including the input latch circuitry 851 (i.e., latch circuitry, d/wen logic and latches) and write driver logic 852), the second transmission gate(s) 754 (e.g., respective second transmission gates for each bitcell column of the respective tier); the second precharge circuitry 756 (i.e., respective bitline precharge circuitry for each bitcell column of the respective tier), and the second bitcell sub-array 722.

As illustrated in FIG. 8, two 3D connections 790 may be transmitted on read and write paths after the transmission gates (e.g., combination read or write column multiplexers on each tier) (i.e., the connections 790 are transmitted "post-mux"). Hence, in this example, just two 3D connections 490 would be configured to run vertically between the two tiers 710, 720 for read and write operations. Advantageously, in such an implementation, a single multi-tier connection can be configured for each post-transmission gate-based multiplexed bitline between the first and second tiers of the memory macro unit.

Figure 9:
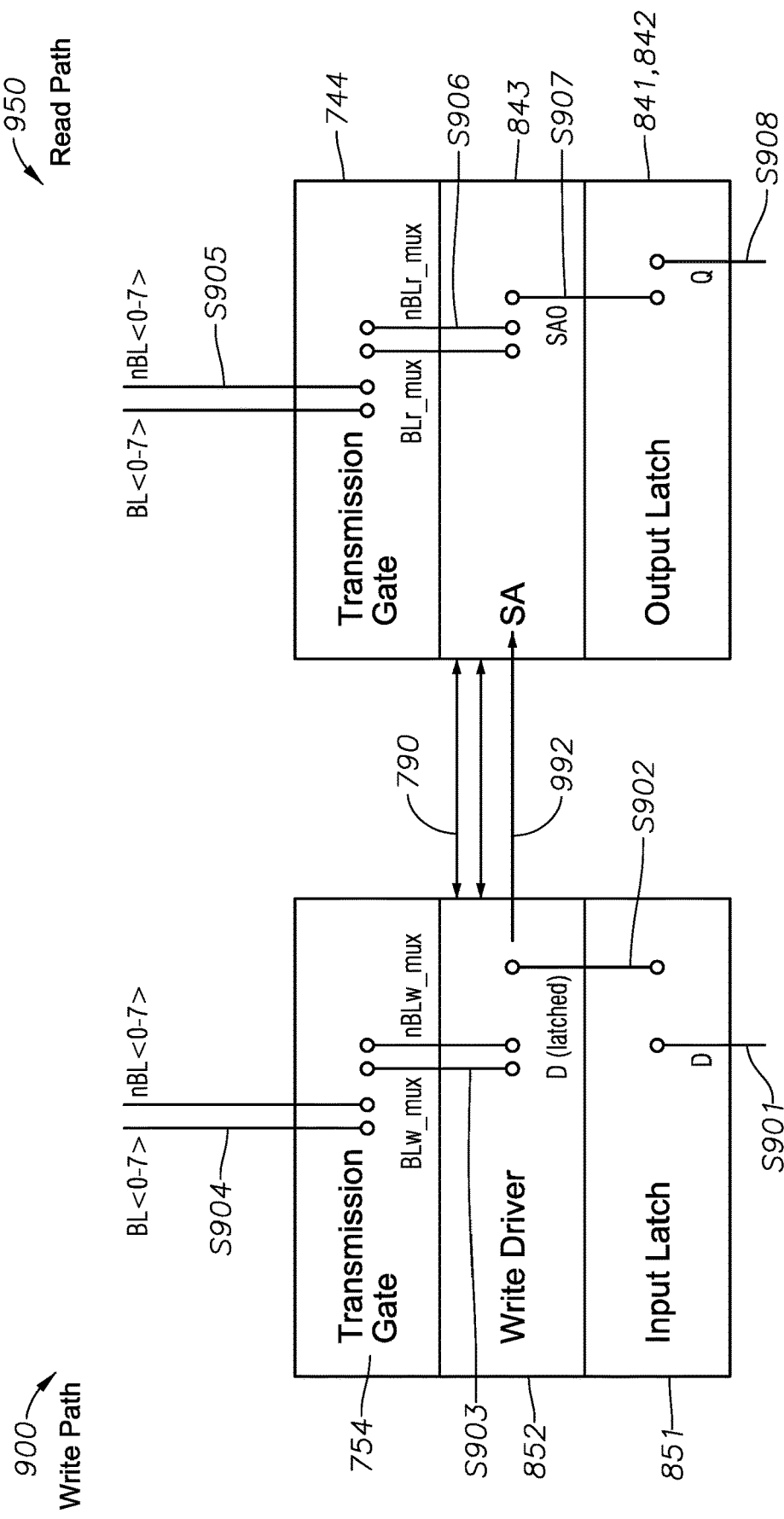
FIG. 9 is a diagrams of a portion of an example integrated circuit in accordance with various implementations described herein.

Referring to FIG. 9, an example write data path 900 and an example read data path 950 on an example "floor plan" of the I/O block implementable with the memory macro unit 700 (as described in FIGS. 7 and 8) are shown. As depicted for the write data path 900 for write operation, at step 901, from outside of the memory macro unit, a "D" input signal (data and write mask pins) may be transmitted to the input latch circuitry 851 (i.e., latch circuitry) of the write circuit 752. Next, at step 902, the input latch circuitry 851 (i.e., latch circuitry) may output a latched version of the D signal to the write driver logic 852. At step 903, from the write driver drive logic 852, each of a BLw_mux signal (i.e., bitline write multiplexer signal) and a complement nBLw_mux signal (i.e., complement bitline write multiplexer signal) may be transferred to one of the first or second transmission gates 744, 754 (i.e., combination read and write column multiplexers). Next, at step 904, the corresponding write signals (e.g., BL <0-7>, nBL <0-7>) may be transmitted through either respective first or second precharge circuitry 746, 756 to the first and second bitcell sub-arrays 712, 722 for write operations.

With reference to the read data path 950 for read operation, at step 905, read signals (e.g., BL <0-7>, nBL <0-7>) may be transmitted from either the first or second bitcell sub-arrays 712, 722 through the respective first or second precharge circuitry 746, 756 to either of the first or second transmission gates 744, 754 (i.e., combination read and write column multiplexers) of the first and second tiers 710, 720. At step 906, each of a BLr_mux signal (i.e., bitline read multiplexer signal) and a complement nBLr_mux signal (i.e., complement bitline read multiplexer signal) may be transferred from one of the first or second transmission gates 744, 754 to the sense amplifier 843 of the read circuit 742. Next, at step 907, from the sense amplifier 843, a resultant sense amplifier output signal (SAO) may be transmitted to the output latch (including sense amplifier latch 842 and Q output logic 841) of the read circuit 742. Lastly, at step 908, a "Q" output signal is transmitted out of the memory macro unit 700.

Of note, with reference to FIG. 9, two 3D connections 790 are transmitted between the first and second tiers 710, 170. More specifically, two fused connections of the two selected pairs are made for the read data lines and for the write data lines (e.g., SD with WDL and NSD with NWDL) for a total of two 3D connections 790. Advantageously, such 3D connections allow for read and write logic sharing between the multiple tiers.

As another feature, with reference to FIGS. 7-9, a design-for-test 692 (DFT) 3D connection pin may be configured. The DFT 692 can be used to test the logic outside of an SRAM bitcell by connecting between the "D" latched signal from the input latch 851 of the write circuitry 752 and directly into the sense amplifier 843 of the read circuitry 742 and output as the sense amplifier output (SAO) signal. Advantageously, in doing so, the DFT 892 may be configured to provide accurate "by-pass" outside-of-SRAM testing without any potential corruption due to errors of the SRAM bitcell itself.

Advantageously, for the above-described implementations with reference to FIGS. 1-9, the folding of bitline and/or wordline signals would result in the reduction of capacitance and/or resistance of such signals. Hence, improvements in power, performance and/or area (PPA) may be realized. For instance, such inventive aspects may provide for a reduction of approximately 40% of I/O area (i.e., footprint, dimensions). Moreover, in certain cases, wire congestion may be reduced due to the separation of the read logic from the write logic. Also, in some instances where memory IO area may be metal limited, routing congestion may be lessened, and thus, can lead to further area gains.

In some cases, better performance may be realized due to smaller wire lengths. As examples, shorter read and write data lines can improve read speed and write margin, and shorter data paths would provide an opportunity for better data setup timing. Moreover, as another benefit, no penalty of the "worst case" access/cycle time compared to baseline array folding would be realized.

Figure 10:
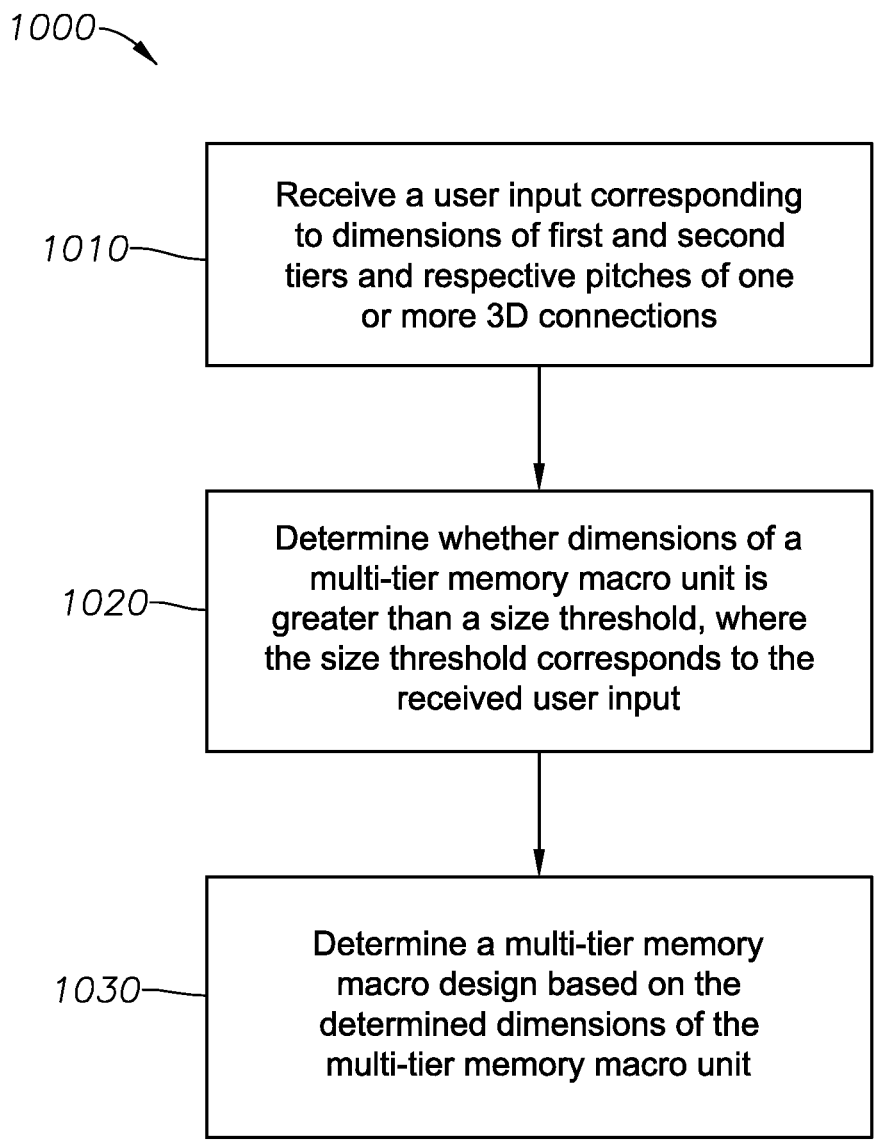
FIG. 10 is an operation method in accordance with various implementations described herein.

Referring to FIG. 10, a flowchart of an example operational method 1000 (i.e., procedure) to apportion an I/O block of a 3D memory macro unit in a memory compiler is shown. Advantageously, in various implementations, the method 1000 may flexibly account for power, performance and area requirements of memory architecture in real-time.

The method 1000 may be implemented with reference to circuit implementations as shown in FIGS. 1-9.

Figure 11:
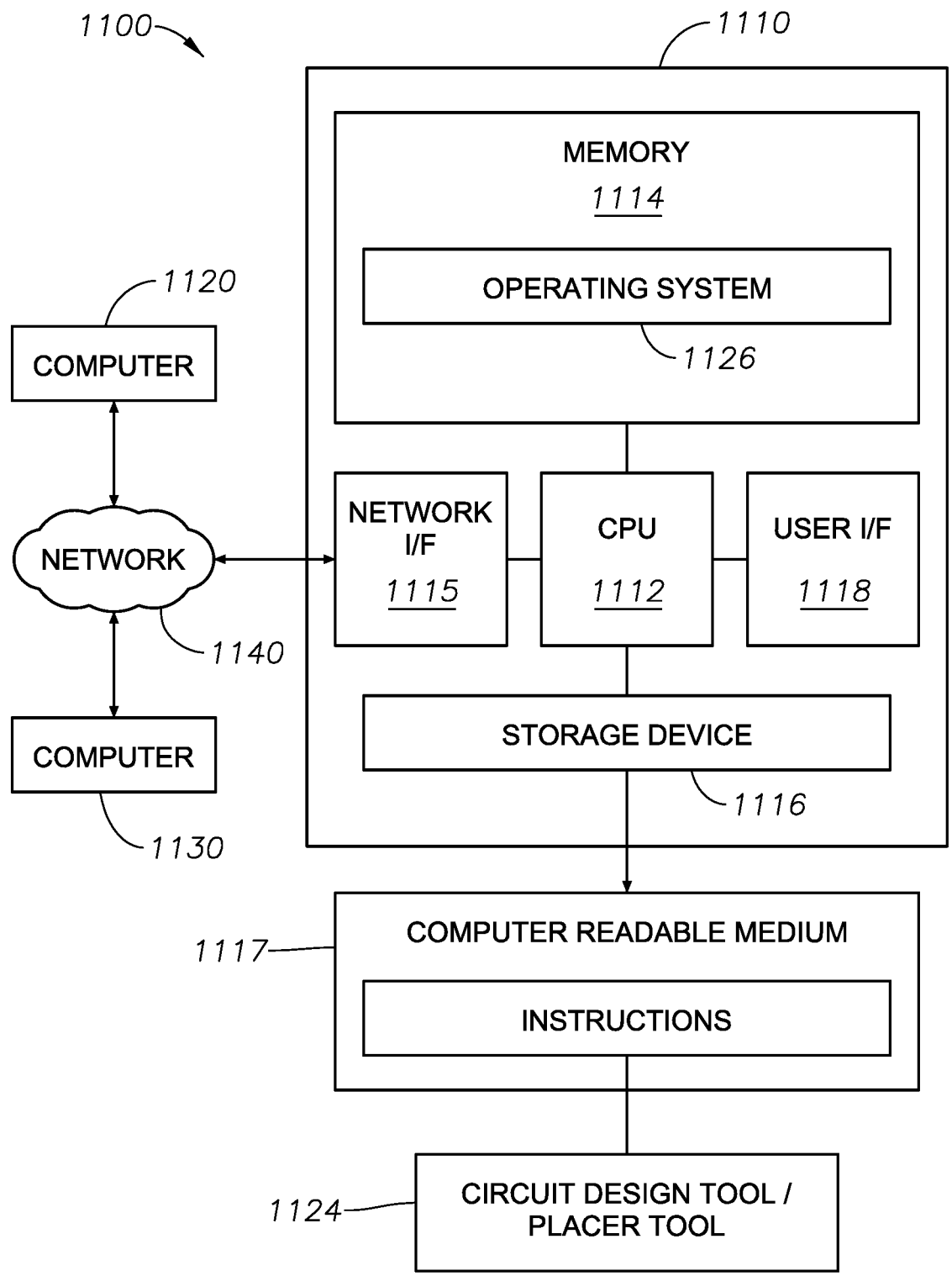
FIG. 11 is a diagram in accordance with various implementations described herein.

At block 1010, the method includes receiving a user input corresponding to dimensions of first and second tiers and respective pitches of one or more 3D connections (i.e., multi-tier connections, inter-tier vias (ITVs)), along with other inputs like technology node, memory capacity, memory options like redundancy, masking, etc. For instance, with reference to various implementations as described in FIGS. 1-9, a central processing unit (as shown in FIG. 11) may execute memory compiler software instructions based on one or more of received user provided first and second tier dimensions (i.e., I/O block dimensions) and/or 3D connection pitch size dimensions (i.e., one or more 3D connection pitch values). As an example, while "small" capacity instances may have acceptable performance in 2D SRAM design, capacities beyond a threshold may result in unacceptable performance. Therefore, SRAMs with capacities beyond a certain threshold may be "compiled" into a 3D SRAM. Further, each of the various implementations, with reference to FIGS. 1-9, include different inter-tier via pitch requirements. Correspondingly, implementations in FIGS. 1-3 have the highest number of connections, followed by the implementations in FIGS. 4-6, followed by the implementations in FIGS. 7-9. Therefore, depending on the technology capabilities of ITV-pitch, the compiler may execute to generate the optimal SRAM instance.

At block 1020, the method includes determining whether dimensions of a multi-tier memory macro unit is greater than a size threshold, where the size threshold corresponds to the received user input. For instance, with reference to various implementations as described in FIGS. 1-9, a central processing unit (as shown in FIG. 11) may execute software instructions (i.e., a memory compiler software program) to determine whether dimensions of a predetermined memory macro unit is greater than a size threshold, where the size threshold corresponds to the received user input (i.e., user provided/user input first and second tier dimensions and/or 3D connection pitch value(s) on the circuit design).

At block 1030, the method includes determining a multi-tier memory macro design based on the determined dimensions of the multi-tier memory macro unit. For instance, with reference to various implementations as described in FIGS. 1-9, a central processing unit (as shown in FIG. 11) may execute software instructions to determine one or more optimized multi-tier designs of a memory macro unit (e.g., 100, 400, 700) based on whether the determined dimensions of the memory macro unit is greater than the size threshold corresponding to the received user input.

Also, according to other aspects of the operational method, an output may be generated based on the determined multi-tier memory macro design. For example, with reference to various implementations as described in FIGS. 1-10, an output (i.e., a generated integrated circuit design including the determined multi-tier memory macro design) (e.g., a memory architecture, multi-threshold offerings for memory compilers) may be generated based on the determined the determined multi-tier memory macro design. In some implementations, the circuit design tool/circuit placer tool 1124 (as described with reference to FIG. 11) may allow users to input a 3D connection pitch value and tier dimensions (i.e., I/O block dimensions), and generate memory macro unit(s) that either fits within a predetermined 3D connection pitch or tier dimensions or provide a new option (i.e., an option allowing for at least taking into account the input parameters or other criteria.

FIG. 11 illustrates example hardware components in the computer system 1100 that may be used to determine an optimized I/O block and to generate an integrated circuit design/memory architecture output. In certain implementations, the example computer system 1100 (e.g., networked computer system and/or server) may include circuit design tool 1124 (i.e., circuit placer tool) and execute software based on the procedure as described with reference to the method 1000 in FIG. 10. In certain implementations, the circuit design tool 1124 may be included as a feature of an existing memory compiler software program allowing users to input a 3D connection pitch and I/O block dimensions, and generate memory macros that either fit with an existing 3D pitch criteria or provide other options that may optimize other criteria such tier (e.g., I/O block) dimensions.

The circuit design tool 1124 may provide generated computer-aided physical layout designs for memory architecture. The procedure 1100 may be stored as program code as instructions 1117 in the computer readable medium of the storage device 1116 (or alternatively, in memory 1114) that may be executed by the computer 1110, or networked computers 1120, 1130, other networked electronic devices (not shown) or a combination thereof. In certain implementations, each of the computers 1110, 1120, 1130 may be any type of computer, computer system, or other programmable electronic device. Further, each of the computers 1110, 1120, 1130 may be implemented using one or more networked computers, e.g., in a cluster or other distributed computing system.

In certain implementations, the system 1100 may be used with semiconductor integrated circuit (IC) designs that contain all standard cells, all blocks or a mixture of standard cells and blocks. In a particular example implementation, the system 1100 may include in its database structures: a collection of cell libraries, one or more technology files, a plurality of cell library format files, a set of top design format files, one or more Open Artwork System Interchange Standard (OASIS/OASIS.MASK) files, and/or at least one EDIF file. The database of the system 1100 may be stored in one or more of memory 1114 or storage devices 1116 of computer 1110 or in networked computers 1120, 1120.

The system 1100 may perform the following functions automatically, with variable user input: logical synthesis; timing and power optimization; clock tree generation; identification of logic designs (i.e., periphery circuit designs (i.e., logic threshold voltages, threshold voltage implant layers)), determination of a desired threshold voltage-combination, determination of minimum voltage assist requirements, identification of bit-cell types, determination of memory specific optimization modes (memory optimization mode), floor-planning, including generation of cell regions sufficient to place all standard cells; standard cell placement; power and ground net routing; global routing; detail routing and pad routing. In some instances, such functions may be performed substantially via user input control. Additionally, such functions can be used in conjunction with the manual capabilities of the system 1100 to produce the target results that are required by a designer. In certain implementations, the system 1100 may also provide for the capability to manually perform functions such as: cell region creation, block placement, pad and cell placement (before and after automatic placement), net routing before and after automatic routing and layout editing. Moreover, verification functions included in the system 1100 may be used to determine the integrity of a design after, for example, manual editing, design rule checking (DRC) and layout versus schematic comparison (LVS).

In one implementation, the computer 1100 includes a central processing unit (CPU) 1112 having at least one hardware-based processor coupled to a memory 1114. The memory 1114 may represent random access memory (RAM) devices of main storage of the computer 1110, supplemental levels of memory (e.g., cache memories, non-volatile or backup memories (e.g., programmable or flash memories)), read-only memories, or combinations thereof. In addition to the memory 1114, the computer system 1100 may include other memory located elsewhere in the computer 1110, such as cache memory in the CPU 1112, as well as any storage capacity used as a virtual memory (e.g., as stored on a storage device 1116 or on another computer coupled to the computer 1110).

The computer 1110 may further be configured to communicate information externally. To interface with a user or operator (e.g., a circuit design engineer), the computer 1110 may include a user interface (I/F) 1118 incorporating one or more user input devices (e.g., a keyboard, a mouse, a touchpad, and/or a microphone, among others) and a display (e.g., a monitor, a liquid crystal display (LCD) panel, light emitting diode (LED), display panel, and/or a speaker, among others). In other examples, user input may be received via another computer or terminal. Furthermore, the computer 1110 may include a network interface (I/F) 1115 which may be coupled to one or more networks 1140 (e.g., a wireless network) to enable communication of information with other computers and electronic devices. The computer 1160 may include analog and/or digital interfaces between the CPU 1112 and each of the components 1114, 1115, 1116, and 1118. Further, other non-limiting hardware environments may be used within the context of example implementations.

The computer 1110 may operate under the control of an operating system 1126 and may execute or otherwise rely upon various computer software applications, components, programs, objects, modules, data structures, etc. (such as the programs associated with the procedure 1000 and related software). The operating system 1126 may be stored in the memory 1114. Operating systems include, but are not limited to, UNIX® (a registered trademark of The Open Group), Linux® (a registered trademark of Linus Torvalds), Windows® (a registered trademark of Microsoft Corporation, Redmond, Wash., United States), AIX® (a registered trademark of International Business Machines (IBM) Corp., Armonk, N.Y., United States) i5/OS® (a registered trademark of IBM Corp.), and others as will occur to those of skill in the art. The operating system 1126 in the example of FIG. 11 is shown in the memory 1114, but components of the aforementioned software may also, or in addition, be stored at non-volatile memory (e.g., on storage device 1116 (data storage) and/or the non-volatile memory (not shown). Moreover, various applications, components, programs, objects, modules, etc. may also execute on one or more processors in another computer coupled to the computer 1110 via the network 1140 (e.g., in a distributed or client-server computing environment) where the processing to implement the functions of a computer program may be allocated to multiple computers 1120, 1130 over the network 1140.

In example implementations, circuit macro diagrams have been provided in FIGS. 1-11, whose redundant description has not been duplicated in the related description of analogous circuit macro diagrams. It is expressly incorporated that the same cell layout diagrams with identical symbols and/or reference numerals are included in each of embodiments based on its corresponding figure(s).

Although one or more of FIGS. 1-11 may illustrate systems, apparatuses, or methods according to the teachings of the disclosure, the disclosure is not limited to these illustrated systems, apparatuses, or methods. One or more functions or components of any of FIGS. 1-11 as illustrated or described herein may be combined with one or more other portions of another of FIGS. 1-11. Accordingly, no single implementation described herein should be construed as limiting and implementations of the disclosure may be suitably combined without departing form the teachings of the disclosure.

Aspects of the present disclosure may be incorporated in a system, a method, and/or a computer program product. The computer program product may include a computer-readable storage medium (or media) having computer-readable program instructions thereon for causing a processor to carry out aspects of the present disclosure. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. For example, the memory 1114, the storage device 1116, or both, may include tangible, non-transitory computer-readable media or storage devices.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some implementations, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, a special purpose computer, or other programmable data processing apparatus to produce a machine, such that the instructions, which execute via the processor of the computer or other programmable data processing apparatus. The machine is an example of means for implementing the functions/acts specified in the flowchart and/or block diagrams. The computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the functions/acts specified in the flowchart and/or block diagrams.

The computer-readable program instructions may also be loaded onto a computer, other programmable data processing apparatus, or other device to cause a series of operational steps to be performed on the computer, other programmable apparatus or other device to perform a computer implemented process, such that the instructions which execute on the computer, other programmable apparatus, or other device implement the functions/acts specified in the flowchart and/or block diagrams.

The flowchart and block diagrams in the Figures illustrate the architecture, functionality, and operation of possible implementations of systems, methods, and computer program products according to various implementations of the present disclosure. In this regard, each block in the flowchart or block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts or carry out combinations of special purpose hardware and computer instructions.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

Illustrative, non-exhaustive examples, which may or may not be claimed, of the subject matter according to the present disclosure are provided below. Different examples of the device(s) and method(s) disclosed herein include a variety of components, features, and functionalities. It should be understood that the various examples of the device(s) and method(s) disclosed herein may include any of the components, features, and functionalities of any of the other examples of the device(s) and method(s) disclosed herein in any combination, and all of such possibilities are intended to be within the scope of the present disclosure. Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. An integrated circuit comprising:
   a memory macro unit comprising:
      an input/output (I/O) circuit block, wherein read/write circuitry of the I/O circuit block is apportioned on first and second tiers of the memory macro unit, wherein a design-for-test multi-tier connection is configured between an output of a write circuitry of the second tier and an input of a read circuitry on the first tier.

2. The integrated circuit of claim 1, wherein read circuitry of the read/write circuitry is arranged on the first tier, and wherein write circuitry of the read/write circuitry is arranged on the second tier.

3. The integrated circuit of claim 1, wherein the memory macro unit comprises:
   respective first and second bitcell sub-arrays for each of the first and second tiers;
   respective row decoders coupled to each of the bitcell arrays; and
   control circuitry coupled to the bitcells sub-arrays, row decoders, and the I/O circuit block.

4. The integrated circuit of claim 3, wherein the I/O circuit block comprises respective first and second input/output (I/O) circuitry coupled for each of the first and second bitcell sub-arrays.

5. The integrated circuit of claim 4, wherein the second I/O circuitry comprises a write circuit and the first I/O circuitry comprises a read circuit.

6. The integrated circuit of claim 1, wherein bitcells of the memory macro unit are configured to share the read/write circuitry on both the first and second tiers of the memory macro unit.

7. The integrated circuit of claim 1, wherein first data is apportioned on a first tier and second data is apportioned on a second tier, and wherein first data comprises data being transmitted into the memory macro unit and second data comprises data being transmitted out of the memory macro unit.

8. The integrated circuit of claim 1, wherein the I/O circuit block is configured to transmit signals between first and second memory bitcell sub-arrays and boundaries of the memory macro unit.

9. An integrated circuit comprising:
   a memory macro unit comprising:
      an input/output (I/O) circuit block, wherein read/write circuitry of the I/O circuit block is apportioned on first and second tiers of the memory macro unit;
      respective first and second bitcell sub-arrays for each of the first and second tiers;
      respective row decoders coupled to each of the bitcell arrays; and
      control circuitry coupled to the bitcells sub-arrays, row decoders, and the I/O circuit block, wherein the I/O circuit block comprises respective first and second input/output (I/O) circuitry coupled for each of the first and second bitcell sub-arrays,
         wherein the first I/O circuitry comprises output logic and latches and respective read column multiplexers for each column of the first bitcell sub-arrays,
         wherein the second I/O circuitry comprises input logic and latches, respective write column multiplexers for each column of the second bitcell sub-arrays,
         and wherein either the first or the second I/O circuitries comprise precharge circuitry for the respective first or second bitcell sub-arrays.

10. The integrated circuit of claim 9, wherein a single multi-tier connection is configured for each bitline between the first and second tiers of the memory macro unit.

11. An integrated circuit comprising:
    a memory macro unit comprising:

an input/output (I/O) circuit block, wherein read/write circuitry of the I/O circuit block is apportioned on first and second tiers of the memory macro unit;

respective first and second bitcell sub-arrays for each of the first and second tiers;

respective row decoders coupled to each of the bitcell arrays; and control circuitry coupled to the bitcells sub-arrays, row decoders, and the I/O circuit block, wherein the I/O circuit block comprises respective first and second input/output (I/O) circuitry coupled for each of the first and second bitcell sub-arrays, and wherein the first I/O circuitry comprises output logic and latches, respective read column multiplexers for each column of the first bitcell sub-arrays, respective write column multiplexers for each column of the first bitcell sub-arrays, and respective precharge circuitry for each column of the first bitcell sub-arrays, and wherein the second I/O circuitry comprises input logic and latches, respective write column multiplexers for each column of the second bitcell sub-arrays, respective read column multiplexers for each column of the second bitcell sub-arrays, and respective precharge circuitry for each column of the second bitcell sub-arrays.

12. The integrated circuit of claim 11, wherein a single multi-tier connection is configured for each post-multiplexed bitline between the first and second tiers of the memory macro unit.

13. An integrated circuit comprising:

a memory macro unit comprising:

an input/output (I/O) circuit block, wherein read/write circuitry of the I/O circuit block is apportioned on first and second tiers of the memory macro unit;

respective first and second bitcell sub-arrays for each of the first and second tiers;

respective row decoders coupled to each of the bitcell arrays; and control circuitry coupled to the bitcells sub-arrays, row decoders, and the I/O circuit block, wherein the I/O circuit block comprises respective first and second input/output (I/O) circuitry coupled for each of the first and second bitcell sub-arrays, wherein the first I/O circuitry comprises output logic and latches, respective transmission gate-based column multiplexers for each column of the first bitcell sub-arrays, and respective precharge circuitry for each column of the first bitcell sub-arrays, and wherein the second I/O circuitry comprises input logic and latches, respective transmission gate-based column multiplexers for each column of the second bitcell sub-arrays, and respective precharge circuitry for each column of the second bitcell sub-arrays.

14. The integrated circuit of claim 13, wherein a single multi-tier connection is configured for each post-transmission gate-based multiplexed bitline between the first and second tiers of the memory macro unit.

15. An integrated circuit comprising:

a memory macro unit comprising:

an input/output (I/O) circuit block, wherein read/write circuitry of the I/O circuit block is apportioned on first and second tiers of the memory macro unit, wherein a single multi-tier connection is configured for each bitline between the first and second tiers of the memory macro unit;

wherein a single multi-tier connection is configured for each post-multiplexed bitline between the first and second tiers of the memory macro unit; or wherein a single multi-tier connection is configured for each post-transmission gate-based multiplexed bitline between the first and second tiers of the memory macro unit.

16. An integrated circuit comprising:

a memory macro unit comprising:

an input/output (I/O) circuit block, wherein a read circuit is arranged on a first tier of the memory macro unit and a write circuit is arranged on a second tier of the memory macro unit, wherein the read circuit and write circuit are coupled by a multi-tier connection for each post-transmission gate-based multiplexed bitline between the read circuit and write circuit of the memory macro unit.

* * * * *